United States Patent
Arslan et al.

(10) Patent No.: US 10,044,374 B2
(45) Date of Patent: Aug. 7, 2018

(54) ADAPTIVE ERASURE CODES

(71) Applicant: Quantum Corporation, San Jose, CA (US)

(72) Inventors: Suayb Arslan, Irvine, CA (US); Turguy Goker, Vista, CA (US)

(73) Assignee: Quantum Corporation, San Jose, CA (US)

( * ) Notice: Subject to any disclaimer, the term of this patent is extended or adjusted under 35 U.S.C. 154(b) by 157 days.

(21) Appl. No.: 14/813,442

(22) Filed: Jul. 30, 2015

(65) Prior Publication Data

US 2017/0033806 A1 Feb. 2, 2017

(51) Int. Cl.
| | |
|---|---|
| *G11C 29/00* | (2006.01) |
| *H03M 13/35* | (2006.01) |
| *G06F 11/10* | (2006.01) |
| *H03M 13/15* | (2006.01) |
| *G06F 3/06* | (2006.01) |

(52) U.S. Cl.
CPC .......... *H03M 13/356* (2013.01); *G06F 3/064* (2013.01); *G06F 3/0619* (2013.01); *G06F 3/0673* (2013.01); *G06F 11/1076* (2013.01); *H03M 13/154* (2013.01)

(58) Field of Classification Search
CPC .............. H03M 13/356; H03M 13/154; G06F 11/1076; G06F 3/0619; G06F 3/064; G06F 3/0673
See application file for complete search history.

(56) References Cited

U.S. PATENT DOCUMENTS

| | | | | |
|---|---|---|---|---|
| 5,307,351 A | * | 4/1994 | Webster | H04J 3/14 370/470 |
| 6,182,264 B1 | * | 1/2001 | Ott | H03M 13/09 714/774 |
| 7,924,761 B1 | * | 4/2011 | Stevens | H03M 13/3761 370/315 |
| 9,431,054 B1 | * | 8/2016 | Goker | H03M 13/2792 |
| 2007/0195905 A1 | * | 8/2007 | Schatz | H04L 1/004 375/265 |
| 2008/0069242 A1 | * | 3/2008 | Xu | H04N 19/89 375/240.24 |

(Continued)

*Primary Examiner* — Guy Lamarre
(74) *Attorney, Agent, or Firm* — Eschweiler & Potashnik, LLC

(57) ABSTRACT

Methods, apparatus, and other embodiments associated with adaptive use of erasure codes for distributed data storage systems are described. One example method includes accessing a message, where the message has a message size, selecting an encoding strategy as a function of the message size, data storage device failure statistics, data storage device wear periods, data storage space constraints, or overhead constraints, and where the encoding strategy includes an erasure code approach, generating an encoded message using the encoding strategy, generating an encoded block, where the encoded block includes the encoded message and metadata associated with the message, and storing the encoded block in the data storage system. Example methods and apparatus may employ Reed Solomon erasure codes or Fountain erasure codes. Example methods and apparatus may display to a user the storage capacity and durability of the data storage system.

20 Claims, 10 Drawing Sheets

(56) References Cited

U.S. PATENT DOCUMENTS

| | | | | |
|---|---|---|---|---|
| 2010/0050057 | A1* | 2/2010 | Luby | H04L 1/0041 |
| | | | | 714/776 |
| 2011/0158096 | A1* | 6/2011 | Leung | H04L 47/35 |
| | | | | 370/232 |
| 2011/0191651 | A1* | 8/2011 | Chen | H03M 13/29 |
| | | | | 714/755 |
| 2011/0299450 | A1* | 12/2011 | Ye | H04L 1/1628 |
| | | | | 370/312 |
| 2012/0096234 | A1* | 4/2012 | Jiang | G11C 11/5678 |
| | | | | 711/170 |
| 2012/0131407 | A1* | 5/2012 | Chiao | H03M 13/356 |
| | | | | 714/751 |
| 2012/0140829 | A1* | 6/2012 | Rane | H04N 19/50 |
| | | | | 375/240.18 |
| 2016/0204865 | A1* | 7/2016 | Boroson | H04B 10/1121 |
| | | | | 398/97 |

\* cited by examiner

US 10,044,374 B2

ADAPTIVE ERASURE CODES

BACKGROUND

Stored data may be protected against storage media failures or other loss by storing extra copies, by storing additional redundant information, or in other ways. One type of redundancy based protection involves using erasure coding. Erasure coding uses additional redundant data to produce erasure codes (EC) that protect against 'erasures'. An erasure may be an error with a location that is known a priori. Erasure codes allow data portions that are lost to be reconstructed from the surviving data. The application of erasure codes to data storage may typically have been for the purpose of recovering data in the face of failures of hardware elements storing the data.

An erasure code is a forward error correction scheme for storage applications. An erasure code transforms a message of k symbols into a longer message. The longer message may be referred to as a code-word with n=k+p symbols such that the original message can be recovered from any available k symbols. Reed Solomon (RS) codes are optimal erasure codes because any available k symbols will suffice for successful reconstruction. However, their encoding and decoding complexity grows at least quadratically with the block length and the number of parity symbols generated. Cauchy RS codes, which are in the Reed-Solomon family of codes, may possess reduced complexity encoding and/or decoding methods, but still suffer from exacerbated Galois field computations and do not scale well with increasing code-word length.

In an encoding agent, k segments of useful data are used to compute a number p parity segments. For convenience, the segment sizes are conventionally chosen to be equal. If a coding agent can compensate for any combination of p segment losses out of k+p total number of segments, the coding agent is said to have an optimal overhead of zero. RS codes are known to be optimal in terms of the number of erasures that can be corrected given the coded block and message block lengths. However, the computational complexity of RS codes may be prohibitive for large block lengths, resulting in k+p including a large number of parity segments, chunks (or symbols) p that may reduce the efficiency of a storage system. Thus, as the coded block length increases, RS codes become less than optimal. RS codes may also become less than optimal when multiple RS encodings are used for a large file, due to increased interleaving overhead.

Additionally, the number of parity symbols p inversely affects the encoding and decoding complexity. Thus, RS codes may only be practical for short block length storage applications where RAID5 or RAID6 type of protection is intended. Furthermore, conventional approaches using RS codes may be prohibitively complex due to large block length/large parity Galois field arithmetic operations. On the other hand, conventional approaches that try to overcome the problems of RS codes by using Fountain erasure codes may suffer from prohibitive overhead inefficiency due to the short block lengths used by Fountain erasure codes.

In a storage system, reliability and efficiency are two main concerns. One of the main objectives of distributed storage or cloud storage is to ensure the reliable protection of user data. However, reliability and efficiency are often conflicting goals. Greater reliability may be achieved at the cost of reduced efficiency. Higher efficiency may be attained at the cost of reduced reliability. Storage devices are subject to wear, damage, and component aging. Storage device reliability decreases over time. An erasure code, or its associated parameters, selected at one point in a storage device's life span may not be the most efficient erasure code or associated parameters for a different period in the storage device's lifespan.

The nature of data and associated storage methods vary dramatically depending on the application. For example, delay sensitive data delivery applications may require short block lengths. Transactional data is one example of such delay sensitive, short block length data. For example, electronic mail usually constitutes short message lengths while high definition video may impose larger message length constraints, Large block size, as used for storing high definition video, may lead to large blocks being pushed to kernel modules to be stored on physical devices. Overhead inefficiency is a particularly important problem for storage applications in which user capacity maximization is one of the outstanding goals given the scale of the overall storage system.

BRIEF DESCRIPTION OF THE DRAWINGS

The accompanying drawings, which are incorporated in and constitute a part of the specification, illustrate various example apparatus, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
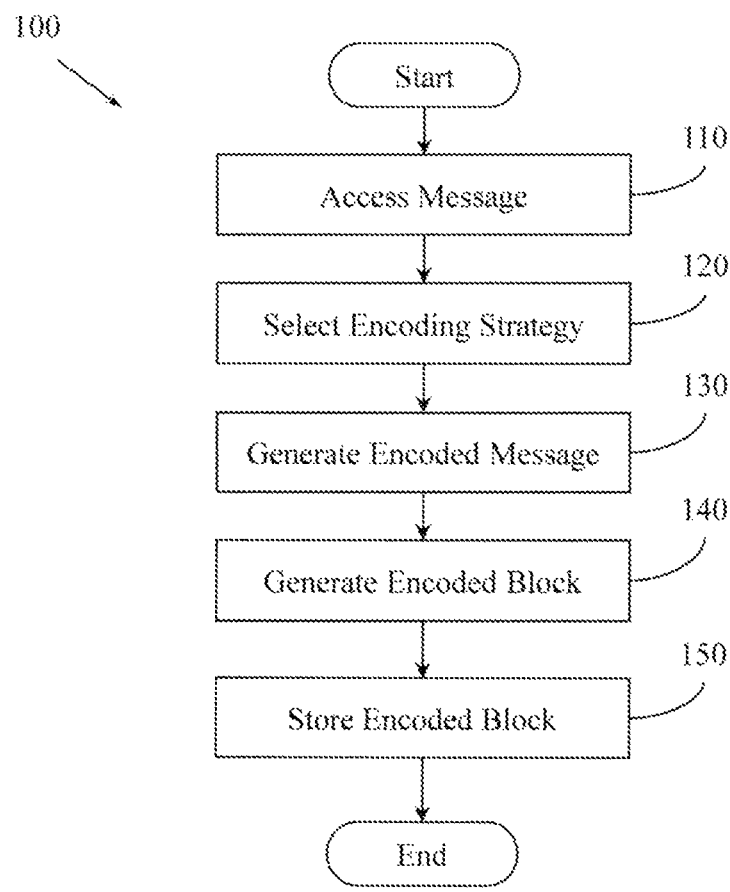
FIG. 1 illustrates an example method for storing data in a data storage system.

Example methods and apparatus improve on conventional cloud data storage approaches by adapting an erasure code approach used for storing data. Example methods and apparatus adapt an erasure code approach based on the length of a message or file to be encoded, drive failure statistics and wear periods of data storage devices and other components in a data storage system, or available hardware capabilities of the data storage system.

Conventional data storage approaches may employ Fountain codes, which are a type of rateless code. Fountain codes provide reliable recovery features while providing efficient implementations because of their low complexity encoding and decoding algorithms. Fountain codes have parameters that can be adjusted on-the-fly to trade overhead efficiency for coding performance. Symbols encoded by rateless codes are conventionally stored in storage nodes. A storage node may be stored in multiple storage units or devices, including hard disk drives (HDD), solid state drives (SSD), tape, shingled magnetic recording (SMR), or hybrid solid state drives (HSSD). However, rateless codes are only asymptotically optimal. Rateless codes, including Fountain codes, perform close to the performance of RS erasure codes only for long code block lengths. In general, encoding a message generates ii coding segments from k message segments. Decoding requires only k of n segments to decode the message content. For short block lengths however, the performance of rateless codes can be undesirable unless a complicated decoding algorithm is adopted. For example, a decoding algorithm based on Gaussian elimination may be used. For medium block lengths, efficient algorithms that give performance closer to Gaussian elimination may be used at the expense of a slight increase in complexity. However, not all applications or data storage systems can bear such a complexity increase due to delay constraints or local computational capabilities. Also, increased complexity may decrease the chance of adaptability using available software and hardware agents including multiple cores, threads, and other storage subsystems.

In conventional storage systems, files or objects may be of different formats and have variable sizes. Conventional systems do not adapt their encoding strategies for different file formats and sizes. For example, while personal emails may only be a few tens of KBs in size, movies and high definition images may require hundreds or even thousands of KBs to store. While Fountain codes may be ideal for large files, smaller files may be stored more efficiently using RS codes. In a conventional storage system, reliability and efficiency are two major concerns. Since for short block lengths, rateless codes may demonstrate degraded performance. RS codes with comparable complexity are frequently used instead. Thus, one conventional system may use Fountain codes for storing large files, while a separate, different conventional system may use RS codes for data with shorter block lengths. Conventional approaches may thus offer sub-optimal performance when forced to store data of different sizes, or may require duplication of hardware to encode and store data using different approaches. Neither conventional approach is optimal. Example methods and apparatus improve on conventional approaches by adapting the encoding approach to the changing nature of stored content without having to use separate systems for different encoding approaches. For example, one embodiment of example methods and apparatus may employ an RS precode or a multiple of RS precodes, or one RS precode and another, simpler, conventional code used in conjunction with a Luby Transform (LT) code, a basic fountain code. In this example, for a short message length, the rate of the RS code may be adjusted and the subsequent LT coding stage may be bypassed. If the message length increase beyond a threshold message length, other precoding stages as well as LT coding stages may be employed to construct a more advanced Fountain code in the coding process.

For long data blocks, RS codes can be used by partitioning the data into appropriately sized chunks and encoding each chunk individually. Although this will lead to manageable complexity and acceptable protection of the data, it will degrade the overall reliability of the system under uniformly random segment losses due to network or hardware failures. These failures may be compensated for by introducing more redundancy into the system. However, adding more redundancy can lead to space inefficient operation. The latter is referred to as the interleaving overhead of the system. Fountain codes have the potential of, if not eliminating, at least minimizing the interleaving overhead to a large extent and providing a better protection methodology for files of certain sizes. Example methods and apparatus improve on conventional systems that may use only RS codes or Fountain codes by adapting the coding approach to, for example, an RS approach or a Fountain approach based, at least in part, on the size of the data segments to be stored.

Hardware components within data storage systems are subject to time dependent wear and failures with time-dependent, non-decreasing hazard rates. Hardware wear and tear should be accounted for in order to guarantee a certain reliability level. Conventional programmable software agents responsible for encoding, decoding, and peripheral storage procedures in a system do not appear to account for this problem. Conventional systems are typically programmed and then are only infrequently changed, or not changed at all, throughout the lifespan of the components of the storage system. Conventional systems thus suffer degrading performance over the long term as hardware degrades, error rates increase, inefficiency increases, and data durability decreases. Example methods and apparatus improve on conventional data storage approaches by embedding an adaptability feature into the mathematical formulation of the constituent erasure correction coding of a data storage system. Example methods and apparatus thus improve on conventional approaches by acknowledging and addressing real life failures and reductions in performance and reliability caused by aging.

Data storage systems may be subject to changing conditions, service guarantees or delay requirements. A data storage system may be required to complete a job within a certain time period, and the time period may change. Depending on the data type, protection requirements, user satisfaction, or data durability goals, the protection methods, coding policies, encoding techniques, and underlying mathematical foundations may be significantly different, Conventional approaches that employ fixed encoding techniques for different sized data segments may not adapt to these kinds of requirements. Example methods and apparatus employ adaptable hardware accelerated instructions. Example methods and apparatus use and adapt multiple threads and parallel computation techniques to adapt, automatically and dynamically, to changing conditions and requirements. For example, the computational workload of a server can show dramatic fluctuations during its life cycle, making computationally complex operations more appropriate in one situation, and other less computationally complex operations more appropriate in a different situation. Example methods and apparatus may employ parallel processing tools to take advantage of changing computational workloads. In one embodiment, if a system's response time decreases, available parallel hardware structure can be utilized in a gradual manner to address the loss due to the increased workload. Example methods and apparatus thus improve on conventional approaches in at least the following measurable ways: A, B, C, & D, described below.

(A) In one embodiment, if a primary server is not powerful enough, example methods and apparatus share computation between other servers. For example, 80% of the computations may be handled by the primary server machine and 20% might be handled by remote nodes. Example methods and apparatus employ parallelizable algorithms and associated computational workloads. Example methods and apparatus thus more efficiently utilize available hardware.

(B) In another embodiment, different erasure codes from different code families may be employed. For a first code family, encoding might be more complex than decoding. For a different code family, decoding might be more complex. Example methods and apparatus choose an appropriate set of codes for the current system conditions and hardware availability.

(C) Example methods and apparatus may also balance the computation load across the entire storage system. In one embodiment, example methods and apparatus employ CPU cores working together with graphical processing unit (GPU) cores to more fully leverage the parallel hardware structure available to the server. Example methods and apparatus thus more efficiently make use of hardware that would otherwise go unused in a conventional system.

(D) Example methods and apparatus may also separate some of the internal foundations of encoding and decoding algorithms, allowing independent processing of different mathematical operations due to module independence. Different modules may work through the computational load in parallel and finally combine their result to complete the computation of the algorithm's ultimate output. Example methods and apparatus thus improve on conventional approaches by parceling out processing to the hardware components most suited for particular processing jobs.

Example methods and apparatus adaptively use erasure codes to encode data. A classical, algebraic erasure code is a forward error correction scheme for storage applications, which transforms a message of k symbols into a longer message. The longer message may be referred to as a code-word. The longer message, or code-word, has n symbols such that the original message can be recovered from any k symbols. Reed-Solomon codes, including Cauchy RS codes, are optimal erasure codes but their encoding/decoding complexity grows at least quadratically in relation to the block length. Furthermore the number of parity symbols (p=n−k) inversely effects the encoding and decoding complexity. Thus, algebraic erasure codes like RS codes are practical for short block length and short message storage applications where RAID5 or RAID6 type of protection is available and appropriate. When the message length is large, conventional RAID architectures may not be optimal or applicable. For example, conventional approaches employing RS codes in a RAID architecture may suffer from high interleaving overhead and a large number of storage units, or may require more parity data to achieve improved protection from real-life, non-random failure cases. Thus, in these kinds of situations, near-optimal erasure codes with linear time encoding/decoding complexities may be preferable to RS codes, Example methods and apparatus employ an adaptive coding strategy that improves on conventional approaches by preventing prohibitive interleaving overhead that would result from short-block length codes being used on a chunked data stream. Example methods and apparatus also improve on conventional approaches by reducing prohibitive complexity that results from large block length, large parity generating Galois field arithmetic operations used by RS erasure codes. Example methods and apparatus further improve on conventional approaches by avoiding prohibitive coding overhead inefficiencies that occur when conventional systems use Fountain codes to encode messages with short block lengths.

Figure 8:
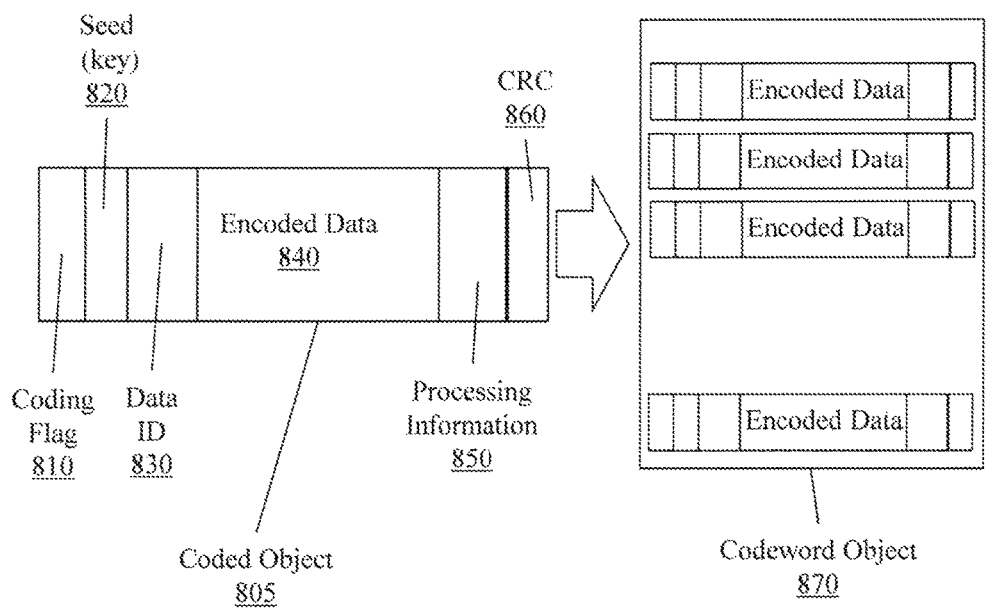
FIG. 8 illustrates an example data structure for storing encoded data.

In one embodiment, a coded block, after encoding, is equipped with a file and an object ID in addition to coding information. Coding information may include a seed for neighborhood information and a flag for what type of code is being used to generate that coded block. Additional metadata may be added to the encoded block. Furthermore: a decoder unit or decoder agent may be equipped with both efficient RS and Fountain code erasure decoders. Decoder agents equipped with both RS and Fountain decoders may be called hybrid decoders. Hybrid decoders optimized for decoding both RS and Fountain codes may decrease the number of logic gates used by the system, providing a quantifiable, tangible improvement on conventional approaches. Based on object level header information, the decoder agent may perform the required operations using the appropriate decoding algorithm. FIG. 8 illustrates an example data structure suitable for use with example methods and apparatus.

The data structure illustrated in FIG. 8 indicates some of the subcomponents of the coded data structure amenable to adaptive features employed in one embodiment. FIG. 8 illustrates that various metadata may be included in a coded object 805 and encoded along with encoded data 840. The metadata may include a seed 820, a coding flag 810, a data ID 830, processing information 850, or a cyclic redundancy check (CRC) code 860. The seed 820 may be a key or password employed as part of the encryption process of a selected encoding strategy, and may be used to produce a generator matrix for a correction code. The coding flag 810 indicates what type of code is used to encode the encoded data 840. If a Fountain type code was used, code related parameters such as a precede name, a code rate, or a pre-code rate may be stored in the coding flag 810. If a Reed-Solomon code is used, the type of the code, the code rate and code-constructing matrix names or other code related properties are stored in the coding flag 810. In one embodiment, example methods and apparatus may be implemented using a Jerasure library. Jerasure is a C library that facilitates erasure coding in storage applications and is described in Technical Report UT-EECS-14-721 published by the University of Tennessee at Knoxville. Another embodiment may be implemented using the library described in U.S. Pat. No. 8,683,296. The data ID 830 is the data block identification number used to identify the order of the coded block. The data ID 830 together with the CRC 860 may be used to constitute a set of inputs for a decoder. The encoded data 840 is the user data encoded by an erasure code. The processing information 850 includes hardware selection related information. In one embodiment, the processing information 850 may include the number of cores used to process the encoded data 840, the types of cores used to process the encoded data 840, single instruction, multiple data (SIMD)-enable information, or the maximum number of threads to run when encoding or decoding the data In another embodiment, other, different, implementation-specific information may be stored in the processing information section 850. The CRC section 860 stores the CRC code used for error detection within the encoded data 840. In one embodiment, based on the CRC result, whether the encoded data 840 may be used in a decoding unit can be determined.

In one embodiment, a code-word object may include a set of coded objects. A file can be broken into several objects and an object can be encoded to produce many codeword objects. In this example, the coded object 805 is the basic unit of storage. In the example illustrated by FIG. 8, codeword object 870 includes a plurality of coded objects 805. Codeword object parameters, including a number of coded objects, an overhead, or redundancy due to header information, are subject to change as required by the example adaptive erasure coding methods and apparatus. A file can be broken into multiple pieces or objects, and pieces or objects can be encoded into one codeword object. Encoded coded objects may be distributed over a plurality of data storage devices, based on failure domains, to achieve separation that facilitates achieving a data durability goal or other policy requirement.

Example methods and apparatus adaptively combine encoding approaches. In one example, a message threshold length m* is set to decide what type of coding strategy may be chosen for storage in order to meet a maximum overhead penalty. In this example, the message length is less than m*. Based on the file size or message length, example methods and apparatus compute an estimate of interleaving overhead Example methods and apparatus also calculate the coding overhead if the file is to be encoded with Fountain codes. If the interleaving overhead is less than a threshold and/or the coding overhead exceeds a threshold, example methods and apparatus use RS erasure codes to encode the message. In another embodiment, the choice of erasure code may be based, in part, on a coding symbol size or available buffer size, Otherwise, Fountain erasure codes, or other probabilistic erasure codes may be used.

Depending on the required number of parities, the type of RS codes can be changed on the fly. For example, based on the required number of parities, example methods and apparatus will determine if the generator matrix is to be constructed using Cauchy matrices or Vandermonde matrices, Additionally, example methods and apparatus determine if the number of parities is two or less. If the number of parities is two or less, efficient algorithms for RAID6 type implementations and XOR-based block-Maximum Distance Separable (MDS) code may be employed. In different embodiments, example methods and apparatus may determine if the number of parities is a number greater than two. For example, STAR coding may employ 3-parity coding, By adaptively switching between different code structures, example methods and apparatus provide increased flexibility and improved performance compared to conventional data storage approaches.

Example methods and apparatus also determine if reliability indicators show that a subcomponent of the data storage system is malfunctioning. The reliability indicators may be self-monitoring, analysis, and reporting technology (SMART) indicators. If a malfunction is detected, or if the reliability indicators are within a reliability threshold, the erasure coding parameters may be adjusted to compensate for the loss of reliability. Adjustable parameters may include the size of a file block to be encoded, a number of data segments to be encoded, a number of parity segments, a storage strip size used by the data storage system, a packetsize used by the data storage system, an internal buffer size of a data storage device, or a memory subsystem in the data storage system. In one example, if RS codes are being used, the parameters of the RS code, including a number of message symbols, a symbol size and a number of redundant blocks to be generated, can be adjusted so as to meet a data durability goal. Fountain code parameters may also be adjusted. Parameters that may be automatically dynamically adjusted include message size, block length, coding overhead, interleaving overhead, a buffer size, or a packet size used by the data storage system.

Some embodiments of example methods and apparatus use algebraic erasure codes and probabilistic erasure codes for encoding and decoding data. Reed Solomon codes are an example of an algebraic erasure code. Fountain codes are an example of a probabilistic erasure code.

Example methods and apparatus may adaptively employ online coding. Online coding is a type of Fountain coding. Conventional data storage approaches may employ Fountain codes for multimedia streaming and large scale data storage. The performance of Fountain codes is measured using averaging arguments. Fountain code performance may also be described by an ensemble average due to the probabilistic nature of Fountain codes. Fountain code performance hinges on the degree and edge selection distributions induced on their graphical representations. Linear Fountain codes use a basic encoding stage called Luby Transform (LT) code with fixed-rate, multiple erasure coding stages on top. For example, online codes use a single precoding stage followed by an LT coding stage with a particular degree selection distribution and rate such that the recovery of the message block is ensured with high probability.

Example methods and apparatus employ adaptive online coding to design a degree distribution for a concatenated fixed rate precode to provide the best reliability within a data storage system's given storage space limitations while the message size changes over time. In one example, the fixed rate precode is optimized for linear time encoding or decoding. Another constraint is the complexity of encoding and decoding, which is limited by the capabilities of available equipment. Example methods and apparatus may employ Fountain codes that use multiple stages of coding, resulting in an improved probability compared to conventional approaches, and ensures that the encoded message is recoverable with high probability.

Figure 9:
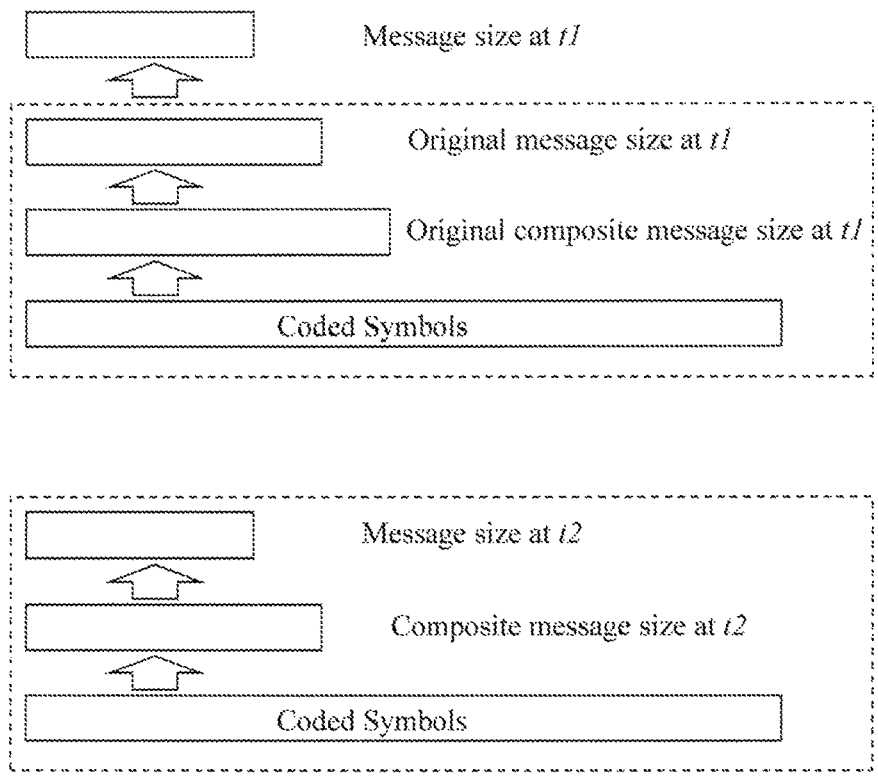
FIG. 9 illustrates an example implementation of a rateless online code adaptively encoding data.

FIG. 9 illustrates an example use case of a rateless online code used in an adaptive manner at two different times $t_1 > t_2$ that is applicable to example methods and apparatus. At time $t_1$, an original message of size $k_1$ is encoded into a composite message of size no bigger than $(1+q_1\gamma_1)k_1$ so that any $1-\gamma_1$ fraction of the composite message will recover the original message symbols with probability $1-\gamma_1 q_1$. Later the composite message is encoded using a standard LT-type encoding to generate coded symbols. Using a degree distribution $\Delta(\gamma_1, \varepsilon_1)$, example methods and apparatus recover $(1-\gamma_1)(1+q_1\gamma_1)k_1$ symbols of the composite message from $(1+\varepsilon_1)$ $k_1$ coded symbols with a decoding complexity of $C_1$. The complexity figure has a direct relationship with the maximum degree $F_1 = (\ln \gamma_1 + \ln(\varepsilon_1/2))/\ln(1-\gamma_1)$ that a coded symbol or an object can take, determined by $\Delta(\gamma_1, \varepsilon_1)$.

Example methods and apparatus may determine at time $t_2$ if a data storage system reliability has fallen under a predetermined threshold τ. In a conventional system, it may take hours or even days for a maintenance agent to take over and replace storage units that are causing the problem. This delay might result in user data loss if precautions are not taken quickly. In one embodiment, an automated process is used to update the user message size within the object to accommodate the increased number of failures in the system. In the example illustrated by FIG. 9, the message size is decreased to $k_2 < k_1$ based on reliability indicators. The reliability indicators may be SMART indicators or other temperature or hardware sensors. The other hardware sensors may include various related kernel modules and specific programming language bindings that may ease the monitoring process. The message is then encoded into a composite message of size no larger than $(1+q_2\gamma_2)k_2$. In this situation, any $1-\gamma_2$ fraction of the composite message will recover the original message symbols with a probability proportional to $1-\gamma_2 q_2$. Example methods and apparatus may then encode the composite message using LT-type encoding with a degree distribution $\Delta(\gamma_2, \varepsilon_2)$ to generate $(1+\varepsilon_1) k_1$ coded symbols with a decoding complexity of $C_2$.

In this example, at time $t_1$, data storage devices are available at all times with a probability of one. That is, each unit is responsive and available to transfer information. However, at time $t_2$, due to aging and wear factors, the probability of data availability drops to $\rho<1$. The probability of data availability may be estimated using SMART information or by patrolling and monitoring tools or monitoring daemons. The average available number of coded symbols are therefore $(1+\varepsilon_1) k_1 \rho = (1+\varepsilon_2) k_2$. Under the constraints $\gamma_2 q_2 \leq \gamma_1 q_1$ (for equivalent durability) and $F_2 \leq F_1$ (for equivalent complexity), example methods and apparatus may find the lower bound $L_{\rho 1}$ on $\rho$ below which maintaining the same data reliability is impossible at the current system time instant when the decision is made. In one embodiment, the lower bound $L_{\rho 1}$ may be used to make decisions on the adaptability features of online codes by varying coding parameters.

In another example, for a given $\rho$ there is a permissible range of $k_2$ that example methods and apparatus can employ to maintain the same or better reliability. However, example methods and apparatus may ensure that $k_2$ is increased or even maximized to open up space for raw user data. Thus, based on the SMART information, or other reliability indicators, example methods and apparatus dynamically and adaptively alters (e.g., maximizes) the allowable message size that will ensure the same or better reliability.

In another embodiment, example methods and apparatus operate at time intervals across the lifespan of a data storage system. For example, one embodiment may monitor the operation of a data storage system at x number of instants $\{t_1, t_2, \ldots, t_x\}$, The time instants $\{t_1, t_2, \ldots, t_x\}$ may be evenly spaced, may be unevenly spaced, or may be spaced automatically and dynamically according to the operating parameters of the data storage system, or according to a user's selection. At a time instant, through solving the optimization problems described herein, online code parameters are adapted to maintaining a threshold reliability level at the expense of storing less user data or incurring a capacity hit. The set of time intervals may induce the set of lower bounds $\{L_{\rho 1}, L_{\rho 2}, \ldots, L_{\rho x}\}$ as the result of the optimization problems that are solved on the fly at the different time instants. In this example, if $L_{\rho(i+1)} < \rho \leq L_{\rho i}$, then example methods and apparatus may use the parameter set $\{k_{(i+1)}, \gamma_{(i+1)}, q_{(i+1)}\}$ while ensuring the complexity relationship $C_{(i+1)} \leq C_1$.

In the examples described herein, as the data storage system scales up or out, example methods and apparatus choose parameters accordingly. For example, if $\rho$ becomes 1 again, previous parameters of the coding stages can be re-attained and the storage space used for raw user data is thus maximized.

Example methods and apparatus may adaptively employ hardware parallelism Data storage systems are subject to user service delivery standards and service guarantees. These guarantees may impose latency requirements. To meet these goals more efficiently than conventional systems, example methods and apparatus utilize the parallel structure of the hardware available to the data storage system. In any coding architecture and the software unit associated with it, there may be a number of loops inside the main encoding or decoding routine, where each loop is responsible for encoding or decoding a part of a large file, making the iterations independent of each other. Furthermore, while encoding or decoding a particular section of the file, there is an inherent loop working out the computation. In many cases, the algebraic operations can be split into parallel components and different components can be run in a separate loop with little or no dependence on the other components. If there are independent loops in an algorithm, example methods and apparatus may parallelize these components although they may share the same part of the memory as I/O systems or subsystems. Thus, considering the delay requirements set by the customer delivery guarantees, serial and parallel parts of the encoding and decoding algorithms, an adaptive use of the available hardware capability makes example methods and apparatus more responsive and agile than conventional approaches.

Figure 10:
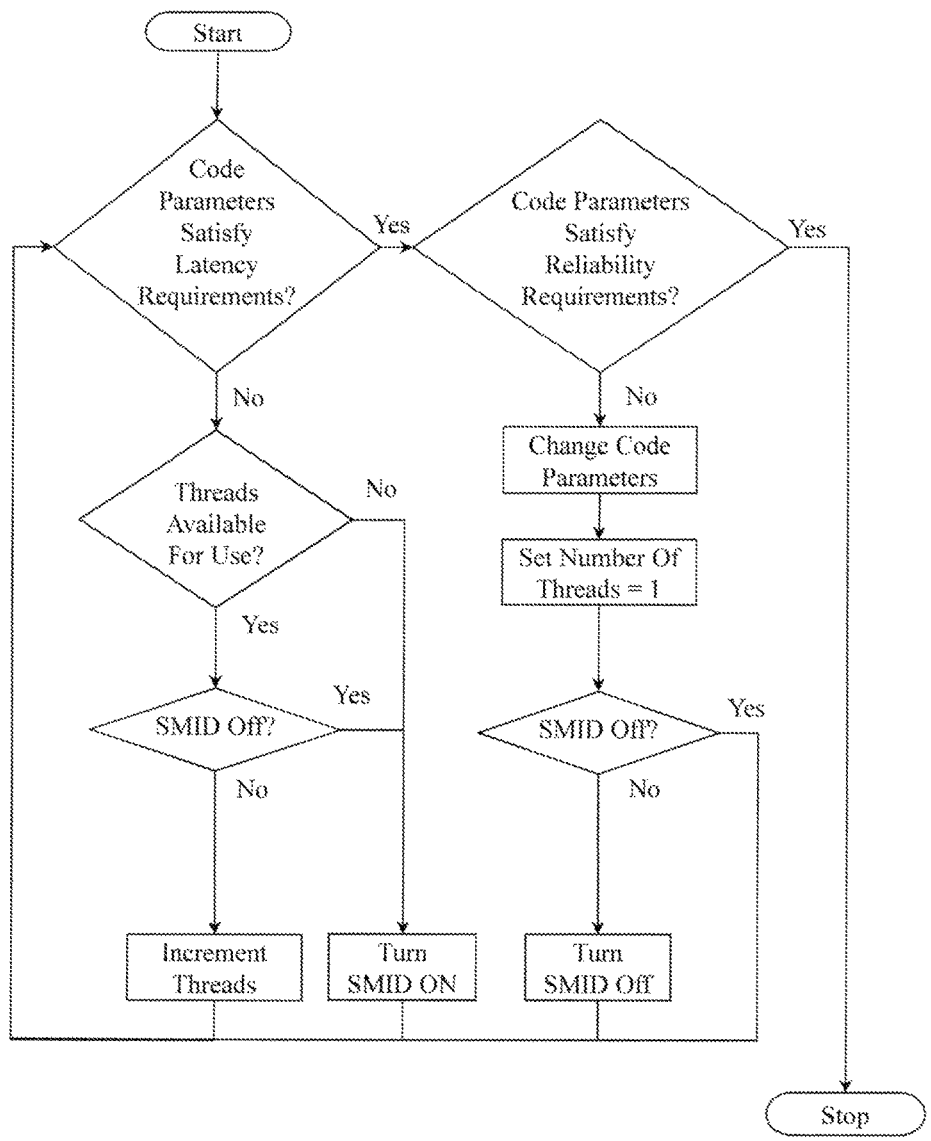
FIG. 10 is a system-level flow diagram of multi-threaded loop handling for adaptively encoding and decoding data.

FIG. 10 is a functional flow diagram that illustrates an example embodiment that exhibits both encoding strategy adaptability and hardware parallelism adaptability. In one embodiment, a set of hardware features might be available. The set of hardware features may include SIMD instruction capability, hyper threaded CPUs, or multi-core CPUs. Once an erasure code is chosen with appropriate parameters based on the SMART reliability metrics, the encode time, decode time, or data delivery times can be estimated. Estimating the encode time, the decode time, or data delivery time may be based, at least in part, on the previous batch performance indicators. The previous batch performance indicators are correlated with the current batch, which increases the accuracy of the estimations. If the overall operation time does not satisfy a user delivery latency guarantee or other requirement or policy, the code parameters may be adjusted on the fly. In another embodiment, code parameters such as buffer size and symbol size may be adjusted to fine tune the execution speed of encoding and decoding. Once the code parameters are found, based on metrics including mean time to data loss (MTTDL), then whether the adaptive system needs to employ and take advantage of SIMD or multi-threaded operation is determined. This is a decision-driven update process and may be automatically and dynamically adapted. If the execution and operation time falls short of the expectation, SIMD is turned on and the number of threads that are working on the computational workload can be incremented until the execution speed pulls the overall operation time below the expected threshold, making the system satisfy the latency requirements. This process is outlined in FIG. 10 at the system level. If the SIMD instructions are not supported by the available hardware, including ARM processors for low power operation, the SIMD on/off check may be skipped and multi-threaded operation may be adapted alone.

In one embodiment, a loop can be run using a single thread with SIMD instructions. The CPU core that is allocated to run this thread may be determined by the operating system and can change over time. Alternatively, the same loop can be broken into a number of independent jobs and jobs may be run by a dedicated thread on a given CPU core, Loops may be run in parallel and with SIMD instructions. In one embodiment, the beginning instant of a job's execution might be different from the beginning instant of another job, making the threads work asynchronously. Finally, the outputs of the individual executions may be combined and processed in memory and pushed out to serve user requests or for further processing. For example, a job could be done in a first instance in a single loop instructions or, in a second, different instance, in multiple independent loops of instructions. Individual loops may be handled by an independent thread to speed up the computational workload. In one embodiment, a server may employ multiple compute nodes, locally or distributed across a network. A compute node may run multiple threads. In this embodiment, the encoding/decoding computational workload may be shared across multiple compute nodes. The workload may be queued by different compute nodes and processed and pushed out to a main encoding engine for reassembly before a client request is responded to.

The detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

FIG. 1 illustrates a computerized method 100 for storing data in a data storage system. Method 100 includes, at 110, accessing a message. The message has a message size. The message may be a file, a chunk of data, a block of data, an object, or other data structure.

Method 100 also includes, at 120, selecting an encoding strategy. The encoding strategy includes an erasure coding approach. The encoding strategy may be selected as a function of the message size. The encoding strategy may also be selected as a function of failure statistics associated with one or more data storage devices in the data storage system. The encoding strategy may also be selected as a function of wear periods associated with one or more data storage devices in the data storage system, of space constraints associated with one or more data storage devices in the data storage system, or of overhead constraints associated with one or more data storage devices in the data storage system. In another embodiment, the encoding strategy may be selected as a function of other properties of the message or the data storage system.

In one embodiment of method 100, the failure statistics associated with the one or more data storage devices include reliability indicators. The reliability indicators may include SMART indicators or other sensor information. In this embodiment, method 100 automatically adjusts the message size as a function of the reliability indicators. Method 100 may also allow a user to manually adjust the message size. In another embodiment, the reliability indicators may include other indicators.

The one or more data storage devices may be susceptible to wear and tear. The one or more data storage devices may also have a life span. For example, a tape drive may have a life span of ten years, and may suffer wear and tear after one year of operation that increases the number of hardware errors it produces. In one embodiment, method 100 selects the encoding strategy as a function of the life span associated with members of the one or more data storage devices. Method 100 may also select the encoding strategy as a function of the current age of members of the one or more data storage devices. For example, method 100 may select a first, probabilistic encoding strategy when a data storage device is in the first half of its life span, but select an algebraic encoding strategy when the data storage device is at least five years old.

In one embodiment of method 100, selecting the encoding strategy includes determining if the message size is less than a threshold size. In one embodiment, the threshold size is 100 KB. In another embodiment, the threshold size may be a different size. The threshold size may be automatically adapted dynamically by method 100, or may be adapted manually by a user. Upon determining that the message is less than a threshold size, method 100, at 120, selects an algebraic erasure code approach. Upon determining that the message size is equal to or greater than the threshold size, method 100 selects, at 120, a probabilistic erasure code approach. In one embodiment, the algebraic erasure code approach uses a Reed-Solomon (RS) code. In this embodiment, the probabilistic erasure code approach uses a Fountain code. In other embodiments, other algebraic or probabilistic erasure codes may be used.

Method 100 also includes, at 130, generating an encoded message from the message Method 100 generates the encoded message using the encoding strategy. For example, if an algebraic erasure code approach was selected, method 100 may, at 130, encode the message using an RS code.

Method 100 also includes, at 140, generating an encoded block. The encoded block includes the encoded message and metadata associated with the message. FIG. 8 illustrates an example data structure for the encoded block that may be employed by example methods and apparatus. In one embodiment, the metadata may include a coding flag, a seed, a data identifier, processing information, or a cyclic redundancy check code. In another embodiment, the metadata may include other data.

Method 100 also includes, at 150, storing the encoded block in the data storage system. The data storage system may include one or more data storage devices. In one embodiment, the one or more data storage devices may include a tape drive, a hard disk drive (HDD), a solid state drive (SSD), a hybrid solid state drive (HSSD), or a shingled magnetic recording (SMR) device. In another embodiment, other types or configurations of data storage devices may be employed.

Method 100 may also include an additional step of decoding the encoded block.

While FIG. 1 illustrates various actions occurring in serial, it is to be appreciated that various actions illustrated in FIG. 1 could occur substantially in parallel. By way of illustration, a first process could access a message, a second process could select an encoding strategy, and a third process could generate an encoded message. While three processes are described, it is to be appreciated that a greater or lesser number of processes could be employed and that lightweight processes, regular processes, threads, and other approaches could be employed.

Figure 2:
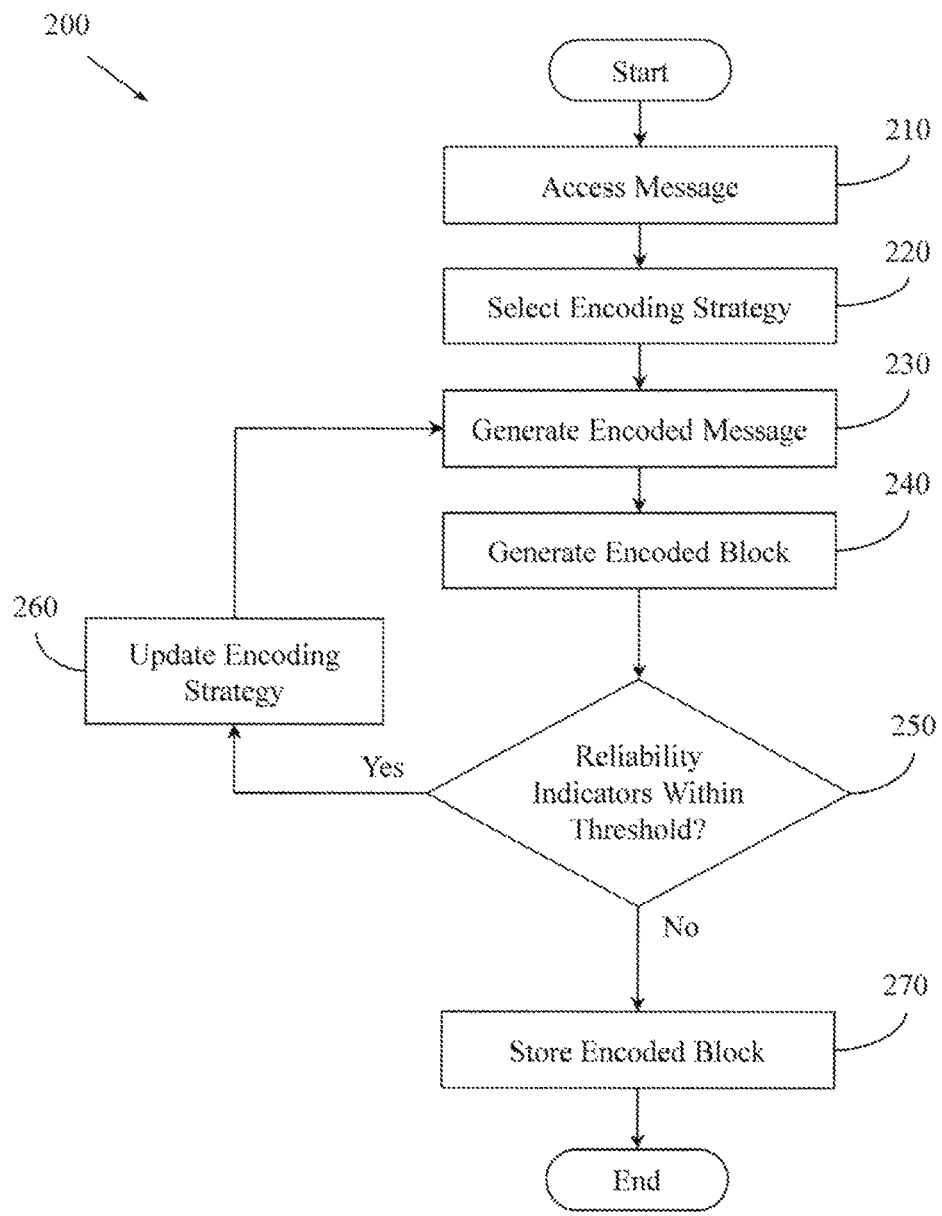
FIG. 2 illustrates an example method for storing data in a data storage system.

FIG. 2 illustrates an example method 200 for storing data in a data storage system. Method 200 is similar to method 100 but includes additional actions. Method 200 includes, at 250, determining if the reliability indicators are within a threshold value. In one embodiment, the reliability indicators are SMART indicators. The threshold value may include a reliability range. For example, if the SMART indicators indicate that the data storage system is operating somewhere between 0 percent and 80 percent of full reliability, method 200 may proceed to step 260.

Upon determining that the reliability indicators are within the threshold range, method 200, at 260, updates the encoding strategy, Updating the encoding strategy may include updating a file block size to be encoded, updating a number of coding segments generated from a message segment, or updating a number of parity segments generated from the message segment. Updating the encoding strategy may also include adjusting a storage strip size used by the data storage system, adjusting a packet size used by the data storage system, adjusting an internal buffer size of the one or more data storage devices, or updating the erasure encoding approach.

Upon determining that the reliability indicators are not within the threshold range, method 200 also includes, at 270, storing the encoded block. For example, if the SMART indicators indicate that the data storage system is operating above 80 percent reliability, method 200 may, at 270, store the encoded block. The reliability value or range may include values or metrics other than percentage of full reliability. For example, the reliability value may include the frequency of errors, the size of physically damaged portions of data storage media, the mean time between failures, or the bit error rate of a data storage device.

Figure 3:
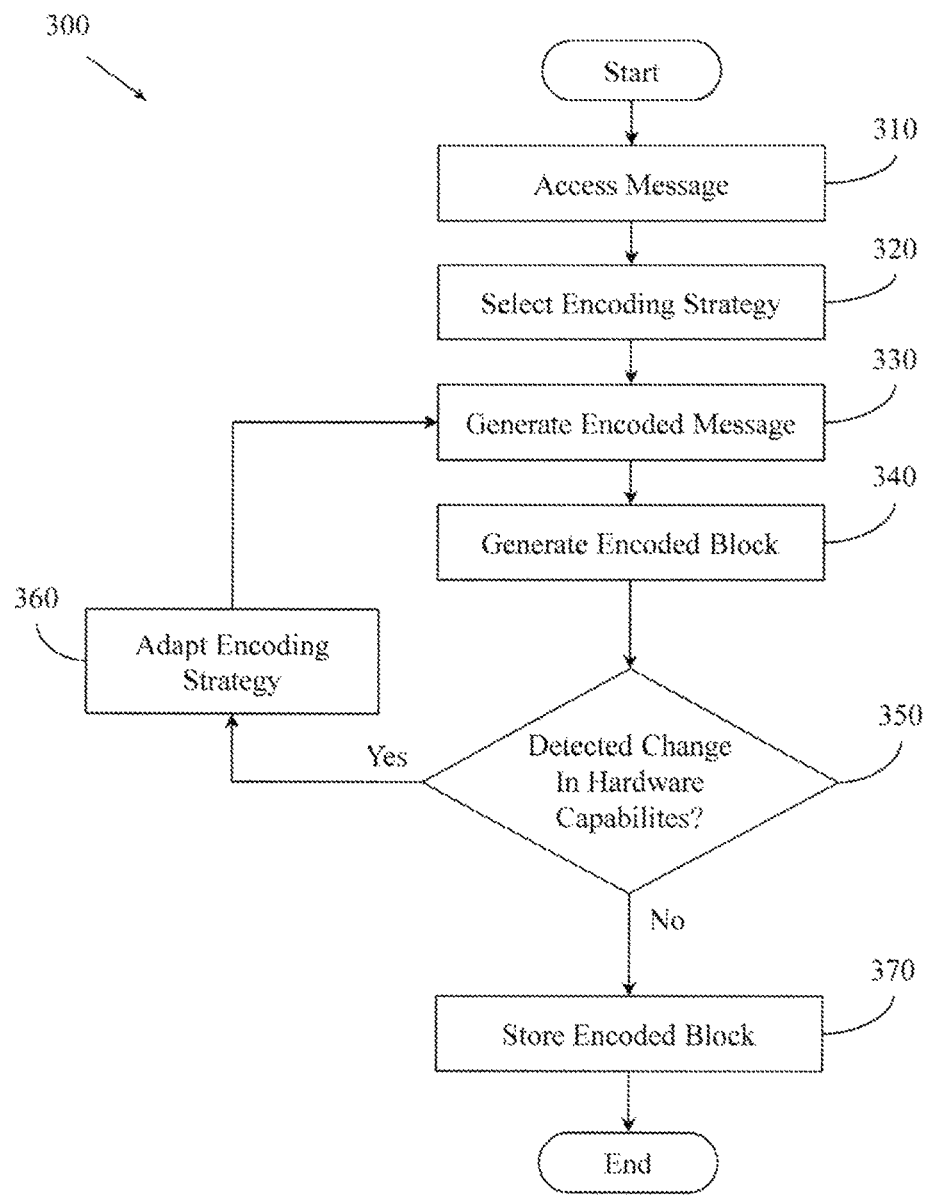
FIG. 3 illustrates an example method for storing data in a data storage system.

FIG. 3 illustrates an example method 300 for storing data in a data storage system. Method 300 is similar to methods 100 and 200, but contains additional steps. At 350, method 300 detects if there has been a change in the available capabilities of hardware within the data storage system. Upon detecting that there has been a change in the available hardware capabilities within the data storage system, method 300 adapts the encoding strategy. Adapting the encoding strategy may include controlling the data storage system to employ SIMD processing or multithreaded processing. Adapting the encoding strategy may also include adapting the number of threads employed by the encoding strategy, changing the type or number of processors used for encoding or decoding, spreading encoded data across different data storage devices, or adding or subtracting data storage devices from the data storage system.

Figure 4:
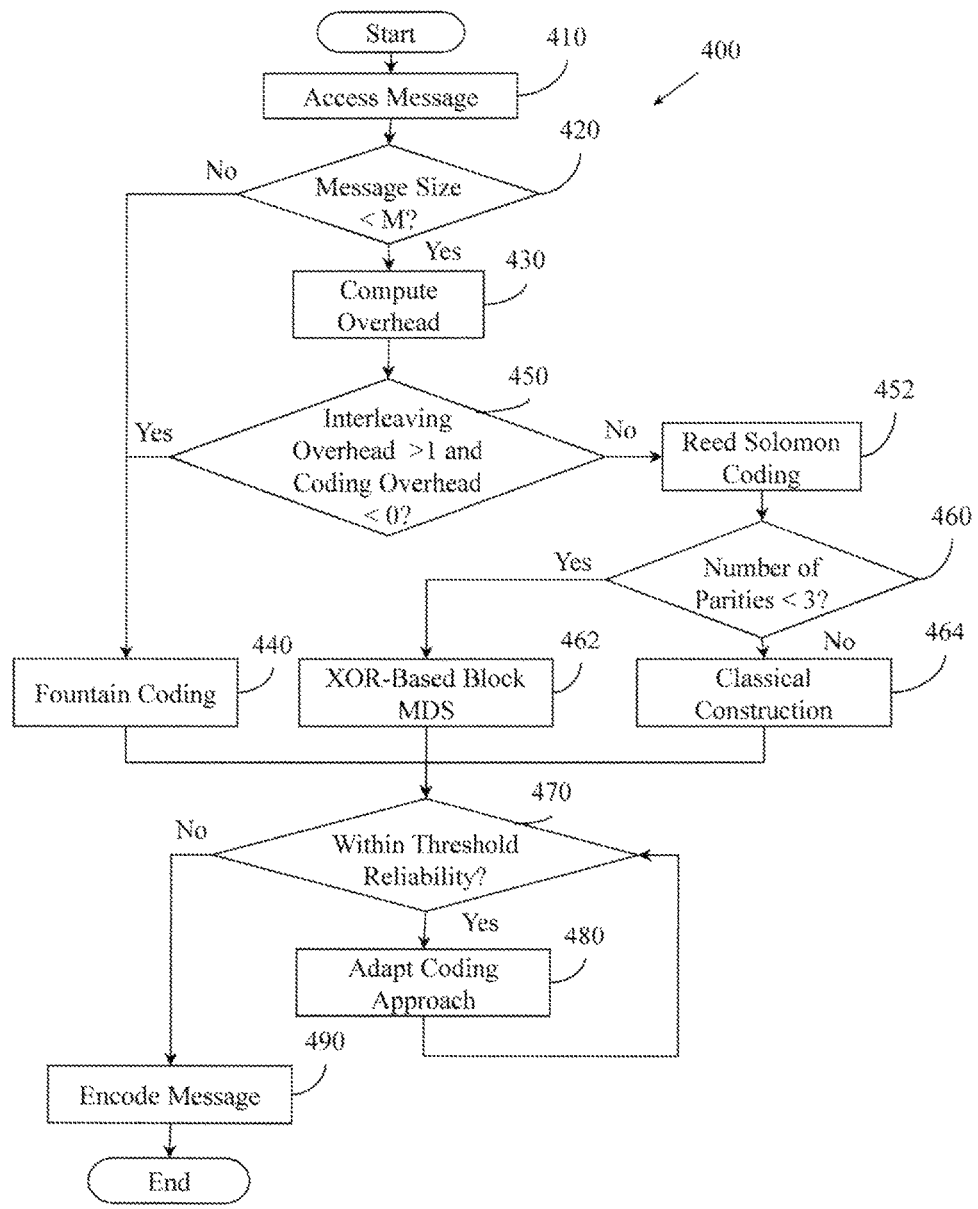
FIG. 4 illustrates an example method for storing data in a distributed data storage system.

FIG. 4 illustrates an example method 400 for encoding a message to be stored in a distributed data storage system. Method 400 includes, at 410, accessing a message. The message has a message size.

Method 400 also includes, at 420, determining whether the message size is less than a threshold size. In one embodiment, the threshold size is 10 KB. In another embodiment, a different threshold size may be used. Upon determining that the message is greater than the threshold size, method 400, at 440, selects a Fountain coding approach as a selected coding approach.

Upon determining that the message size is less than or equal to the threshold size, method 400, at 430, computes an interleaving overhead. Method 400 also includes, at 430, computing a coding overhead.

Method 400 also includes, at 450, determining if the interleaving overhead is greater than one, and if the coding overhead is less than zero. Upon determining that the interleaving overhead is greater than one and the coding overhead is less than zero, method 400, at 440, selects a Fountain coding approach as the selected coding approach. In one embodiment, the Fountain coding approach is an online coding approach, a Raptor coding approach, or a Rapar coding approach. While an interleaving overhead of one and a coding overhead of zero are described, other thresholds may be employed in other embodiments.

Upon detecting that the interleaving overhead is not greater than one and that the coding overhead is not less than zero, method 400, at 452, selects a Reed Solomon coding approach as the selected coding approach.

Method 400, at 460, determines the number of parities. Upon detecting that the number of parities is less than three, method 400, at 462, uses an exclusive or (XOR) based block-maximum distance separable (MDS) coding approach as the selected coding approach. In one embodiment, the XOR-block MDS coding approach is a Blaum-Roth coding approach, an even-odd coding approach, a row-diagonal parity (RDP) coding approach, a STAR coding approach, or an X-coding approach.

Method 400, upon detecting that the number of parities is greater than or equal to three, at 464 uses a classical construction coding approach as the selected coding approach. In one embodiment, the classical construction coding approach is a Cauchy-RS coding approach, or a Vendermonde-RS coding approach. In another embodiment, other classical construction coding approaches may be used. While three parities are described, other numbers of parities may be used in other embodiments. For example, if a STAR coding approach is employed, and the number of parities is less than four, method 400, at 462 uses an exclusive or (XOR) based block-maximum distance separable (MDS) coding approach as the selected coding approach.

Method 400, at 470, determines if the data storage system is within a threshold reliability level. Upon determining that the data storage system is within a threshold reliability level, method 400, at 480, automatically and dynamically generates an adapted coding approach. Method 400 generates the adapted coding approach by adjusting a set of coding parameters. The set of coding parameters is based, at least in part, on the selected coding approach. In one embodiment, the set of coding parameters includes a number of data units k to be encoded or decoded, a number of coded units 17, or a number of parity units p. The set of coding parameters may also include a word size that IS defined for RS and XOR-based block MDS codes, Information is encoded based on symbols of the defined word size. The set of coding parameters may also include a packet size. The packet size may indicate the size of an encoding packet in bytes, or in other units of measurement. The set of coding parameters may also include a symbol size, in bytes, or in another unit of measurement, of an encoding symbol. The set of parameters may also include a buffer size. The buffer size indicates the size of the data in bytes, or in another unit of measurement, that is going to be accessed at a time. The set of parameters may also include a decoder failure probability $\gamma$. The decoder failure probability indicates the failure probability for a decoder decoding Fountain type codes. The set of parameters may also include a coding parameter q for online codes, or a coding overhead ε, for Fountain codes. In one embodiment, the coding overhead is zero for RS codes. The set of parameters may also include a degree distribution $\Delta(\gamma,\varepsilon)$, which represents a degree of distribution for Fountain codes. The set of parameters may also include a precode rate $r_p$. The precode rate indicates the rate of precoding defined for Fountain codes. In one embodiment, the precode rate approaches one. In one embodiment, the set of parameters may also include a plurality of precodes. In a different embodiment, the set of coding parameters includes all the recited parameters. In another embodiment, the set of coding parameters includes different parameters.

Upon determining that the data storage system is not within the threshold reliability level, method 400, at 490, encodes the message using the adapted coding approach. For example, if the method 400 detects that the data storage system is operating at 100% reliability, method 400, at 490, may encode the message. In one embodiment, method 400 may also include decoding the message.

Figure 5:
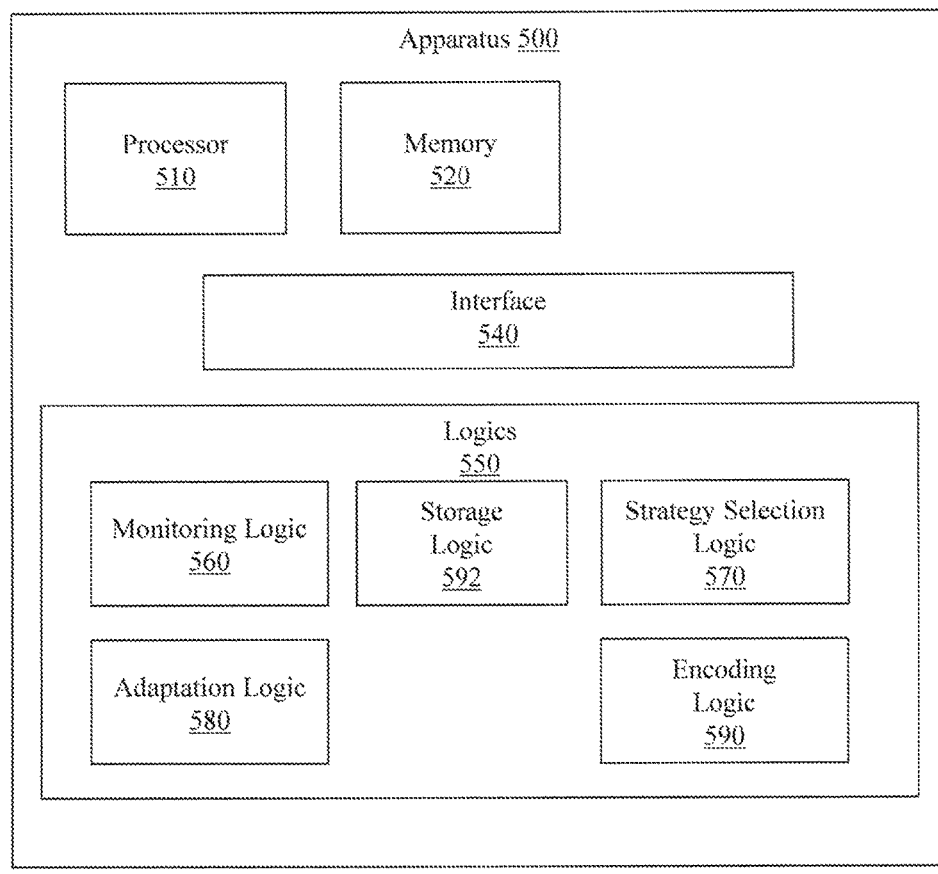
FIG. 5 illustrates an example apparatus for storing a message in a set of data storage devices.

FIG. 5 illustrates an example apparatus 500 for storing a message in a set of data storage devices. Apparatus 500 includes a processor 510, a memory 520, a set of logics 550, and an interface 540 that connects the processor 510, the memory 520, and the set of logics 550. The set of logics 550 includes a monitoring logic 560, a strategy selection logic 570, an adaptation logic 580, an encoding logic 590, and a storage logic 592. In one embodiment, the functionality associated with the set of logics 550 may be performed, at least in part, by hardware logic components. The hardware logic components may include, but are not limited to, field-programmable gate arrays (FPGAs), application specific integrated circuits (ASICs), application specific standard products (ASSPs), system on a chip systems (SOCs), graphic processing units (GPUs), or complex programmable logic devices (CPLDs). In one embodiment, individual members of the set of logics 550 are implemented as ASICs or SOCs. Apparatus 500 may be operably connected to the set of data storage devices.

In one embodiment of apparatus 500, monitoring logic 560, strategy selection logic 570, adaptation logic 580, encoding logic 590, and storage logic 592 are FPGAs, ASSPs, SOCs, or CPLDs. In another embodiment, monitoring logic 560, strategy selection logic 570, adaptation logic 580, encoding logic 590, and storage logic 592 may be other types of systems or circuits.

In one embodiment, monitoring logic 560 monitors a set of operating parameters associated with the set of data storage devices. The set of operating parameters may include data storage device failure statistics associated with members of the set of data storage devices, data storage device wear periods associated with members of the set of data storage devices, or data storage space constraints associated with members of the set of data storage devices. The set of operating parameters may also include hardware capabilities available for members of the set of data storage devices, overhead constraints associated with members of the set of data storage devices, or data storage device life spans associated with members of the set of data storage devices. The set of operating parameters may additionally include a data protection policy, or a property of the message. In another embodiment, the set of operating parameters may include other, different parameters. The set of operating parameters may be user defined or updated.

In one embodiment, strategy selection logic 570 selects an encoding strategy based on a property of the message or the set of operating parameters. The encoding strategy includes an encoding technique. The encoding technique may include a Reed Solomon coding technique, a Fountain coding technique, a Raptor coding technique, or an XOR-block MDS coding technique. In another embodiment, the encoding technique may include any probabilistic encoding technique or algebraic encoding technique.

In one embodiment, adaptation logic 580 adapts the encoding strategy as a function of the set of operating parameters. Adaptation logic 580 may automatically dynamically adapt the encoding strategy by adjusting the encoding technique, a number of data units to be encoded, a number of coded units generated from the number of data units, or a number of parity units generated from the number of data units. Adaptation logic 580 may also automatically dynamically adapt a word size associated with the encoding technique, a packet size associated with the encoding technique, a symbol size associated with the encoding technique, a buffer size of a member of the set of data storage devices, or a decoder failure probability. Adaptation logic 580 may additionally automatically dynamically adapt a coding parameter for an online coding technique, a coding overhead for a Fountain coding technique, a degree of distribution for a Fountain coding technique, a precode rate for a Fountain coding technique, a plurality of precodes, a level of hardware acceleration used by the encoding logic, or a level of hardware parallelism used by the encoding logic. In one embodiment, adaptation logic 580 adapts the encoding strategy as a function of the entire set of operating parameters.

In one embodiment, encoding logic 590 generates an encoded message by encoding the message using the encoding strategy. Encoding logic 590 generates an encoded message by encoding the message using the encoding strategy and by associating metadata with the encoded message. In this example, the metadata includes a coding flag, a seed, a data ID, processing information, or a cyclic redundancy check (CRC). In another embodiment, the metadata may include other, different information.

Encoding logic 590 may, upon determining that the message is within a threshold size, precode the message using an online code before generating the encoded message. In one embodiment, the threshold size is 10 KB. The threshold size may be automatically dynamically adjusted based on the set of operating parameters. In one embodiment, storage logic 592 stores the encoded message in the distributed storage system.

Figure 6:
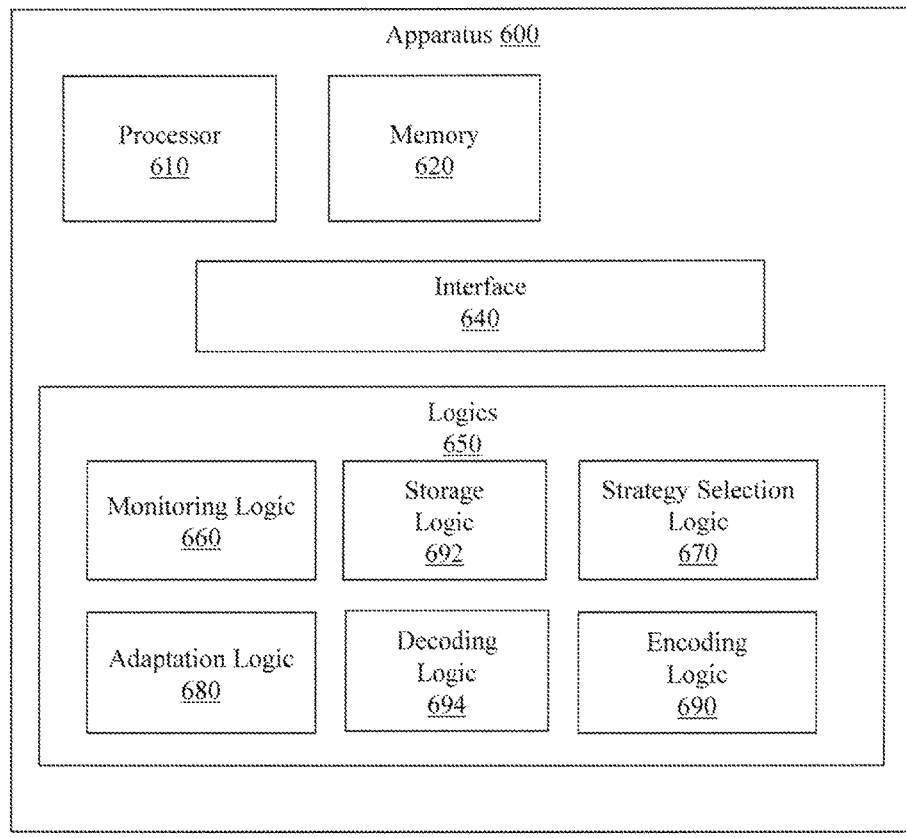
FIG. 6 illustrates an example apparatus for storing a message in a set of data storage devices.

FIG. 6 illustrates an example apparatus 600 for storing a message in a set of data storage devices. Apparatus 600 is similar to apparatus 500, but includes additional logics. In one embodiment, apparatus 600 includes decoding logic 694 that decodes the encoded message. Apparatus 600 may also include a display logic that displays the current status of the data storage system, including the available storage space as a function of the encoding strategy.

While FIGS. 5-6 illustrate example apparatuses 500 and 600 that include various components connected in various ways, it is to be appreciated that other apparatus may include other components connected in other ways.

Figure 7:
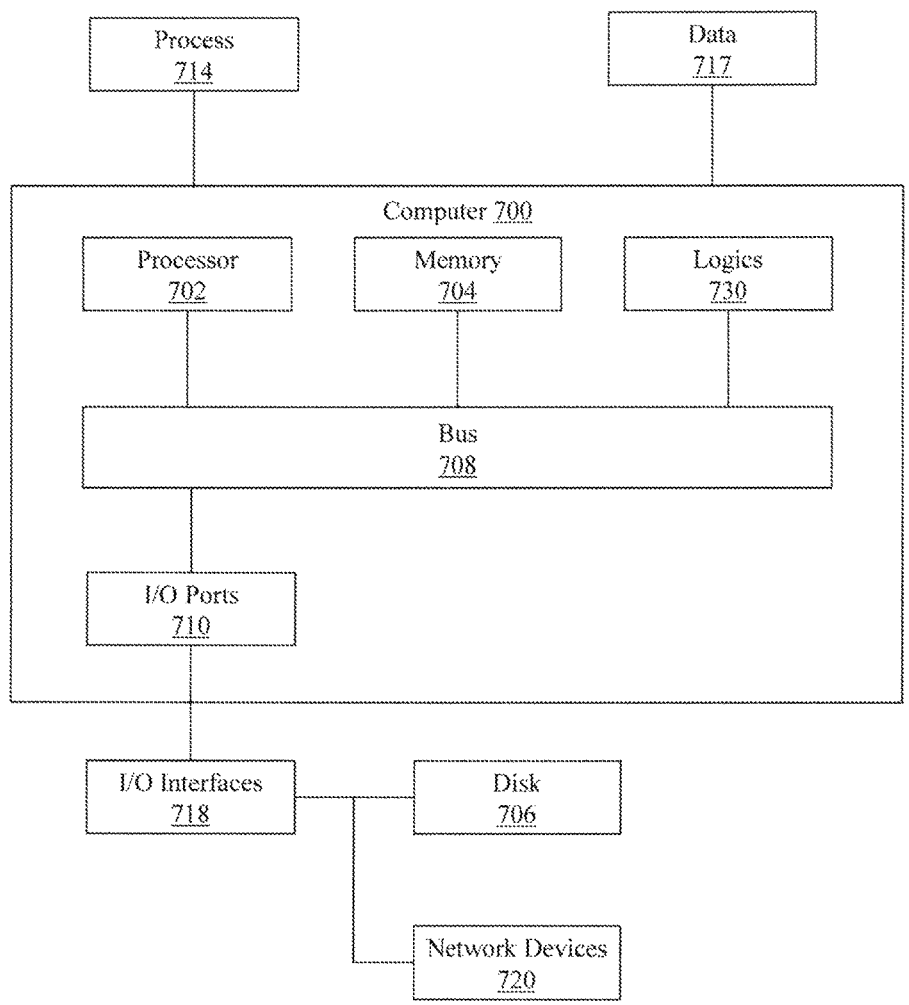
FIG. 7 illustrates an example computer in which example methods and apparatus may be implemented.

FIG. 7 illustrates an example computer 700 in which example methods illustrated herein can operate and in which example logics may be implemented. In different examples, computer 700 may be part of a tape data storage system, a disk data storage system, a solid state data storage system, a hybrid data storage system, or may be operably connectable to a data storage system.

Computer 700 includes a processor 702, a memory 704, and input/output ports 710 operably connected by a bus 708.

In one example, computer 700 may include a set of logics 730 that perform a method of storing a message in a distributed data storage system using adaptive erasure codes. Thus, the set of logics 730, whether implemented in computer 700 as hardware, firmware, software, and/or a combination thereof may provide means (e.g., hardware, software) for storing a message in a distributed data storage system using adaptive erasure codes. In different examples, the set of logics 730 may be permanently and/or removably attached to computer 700. In one embodiment, the functionality associated with the set of logics 730 may be performed, at least in part, by hardware logic components including, but not limited to, FPGAs, ASICs, ASSPs, SOCs, or CPLDs. In one embodiment, individual members of the set of logics 730 are implemented as ASICs or SOCs.

Processor 702 can be a variety of various processors including dual microprocessor and other multi-processor architectures. Memory 704 can include volatile memory and/or non-volatile memory. A disk 706 may be operably connected to computer 700 via, for example, an input/output interface (e.g., card, device) 718 and an input/output port 710. Disk 706 may include, but is not limited to: devices like a magnetic disk drive, a tape drive, a Zip drive, a flash memory card, or a memory stick. Furthermore, disk 706 may include optical drives like a CD-ROM or a digital video ROM drive (DVD ROM). Memory 704 can store processes 714 or data 717, for example. Disk 706 or memory 704 can store an operating system that controls and allocates resources of computer 700.

Bus 708 can be a single internal bus interconnect architecture or other bus or mesh architectures. While a single bus is illustrated, it is to be appreciated that computer 700 may communicate with various devices, logics, and peripherals using other busses that are not illustrated (e.g., PCIE, SATA, Infiniband, 1394, USB, Ethernet).

Computer 700 may interact with input/output devices via I/O interfaces 718 and input/output ports 710. Input/output devices can include, but are not limited to, a keyboard, a microphone, a pointing and selection device, cameras, video cards, displays, disk 706, network devices 720, or other devices. Input/output ports 710 can include but are not limited to, serial ports, parallel ports, or USB ports.

Computer 700 may operate in a network environment and thus may be connected to network devices 720 via I/O interfaces 718 or I/O ports 710. Through the network devices 720, computer 700 may interact with a network. Through the network, computer 700 may be logically connected to remote computers. The networks with which computer 700 may interact include, but are not limited to, a local area network (LAN), a wide area network (WAN), or other networks.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores instructions or data. "Computer-readable storage medium" does not refer to propagated signals. A computer-readable storage medium may take forms, including, but not limited to, non-volatile media, and volatile media. Non-volatile media may include, for example, optical disks, magnetic disks, tapes, and other media. Volatile media may include, for example, semiconductor memories, dynamic memory, and other media. Common forms of a computer-readable storage medium may include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

"Logic", as used herein, includes but is not limited to hardware, firmware, software in execution on a machine, or combinations of each to perform a function(s) or an action(s), or to cause a function or action from another logic, method, or system. Logic may include a software controlled microprocessor, a discrete logic (e.g., ASIC), an analog circuit, a digital circuit, a programmed logic device, a memory device containing instructions, and other physical devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

To the extent that the term "includes" or "including" is employed in the detailed description or the claims, it is intended to be inclusive in a manner similar to the term "comprising" as that term is interpreted when employed as a transitional word in a claim.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A Garner, A Dictionary of Modern Legal Usage 624 (2d. Ed. 1995).

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. A non-transitory computer-readable storage medium storing computer executable instructions that when executed by a computer control the computer to perform a method for encoding a message to be stored in a distributed data storage system, the method comprising:

accessing a plurality of messages, where a member of the plurality of messages has a message size;

upon determining that the message size of the member of the plurality of messages is greater than or equal to a threshold size:
    selecting a Fountain coding approach as a selected coding approach;
upon determining that the message size of the member of the plurality of messages is less than the threshold size:
    computing an interleaving overhead;
    computing a coding overhead;
    upon determining that the interleaving overhead is greater than one and the coding overhead is less than a threshold coding overhead amount:
        selecting a Fountain coding approach as the selected coding approach;
    upon detecting that the interleaving overhead is not greater than one and the coding overhead is not less than the threshold coding overhead amount:
        selecting a Reed Solomon coding approach as the selected coding approach;
upon detecting that a number of parities is less than a threshold number of parities, where the threshold number of parities is four when a STAR coding approach is employed, and where the threshold number of parities is three when a non-STAR coding approach is employed:
    using an exclusive or (XOR) based block-maximum distance separable (MDS) coding approach as the selected coding approach;
upon detecting that the number of parities is greater than or equal to the threshold number of parities:
    using a classical construction coding approach as the selected coding approach;
upon determining that the data storage system is within a threshold reliability level:
    automatically and dynamically generating an adapted coding approach by adjusting a set of coding parameters, where the set of coding parameters is based, at least in part, on the selected coding approach;
upon determining that the data storage system is not within the threshold reliability level, encoding the message using the adapted coding approach, and storing the encoded message in the distributed data storage system.

2. The non-transitory computer-readable storage medium of claim 1, the method comprising decoding the message, where decoding the message includes controlling a Reed Solomon (RS) code decoder, a Fountain code decoder, or a hybrid decoder to decode the encoded message.

3. The non-transitory computer-readable storage medium of claim 2, where the threshold size is 10 KB.

4. The non-transitory computer-readable storage medium of claim 3, where the set of coding parameters includes:
a number of data units k;
a number of coded units n;
a number of parity units p;
a word size;
a packet size;
a symbol size;
a buffer size;
a decoder failure probability $\gamma$;
a coding parameter q;
a coding overhead $\varepsilon$;
a degree distribution $\Delta(\gamma,\varepsilon)$; or
a precode rate $r_p$.

5. The non-transitory computer-readable storage medium of claim 4, where the classical construction coding approach is a Cauchy-RS coding approach or a Vandermonde-RS coding approach.

6. The non-transitory computer-readable storage medium of claim 5, where the XOR-block MDS coding approach is a Blaum-Roth coding approach, an even-odd coding approach, a row-diagonal parity (RDP) coding approach, a STAR coding approach, or an X-coding approach.

7. The non-transitory computer-readable storage medium of claim 6 where the Fountain coding approach is an online coding approach, a Raptor coding approach, or a Rapar coding approach.

8. The non-transitory computer-readable storage medium of claim 3, where the set of coding parameters includes:
a number of data units k;
a number of coded units n;
a number of parity units p;
a word size;
a packet size;
a symbol size;
a buffer size;
a decoder failure probability $\gamma$;
a coding parameter q;
a coding overhead $\varepsilon$;
a degree distribution $\Delta(\gamma,\varepsilon)$; and
a precode rate $r_p$.

9. The non-transitory computer-readable storage medium of claim 7, the method comprising precoding the message.

10. The non-transitory computer-readable storage medium of claim 9, where precoding the message includes precoding the message with an RS precode, a multiple of RS precodes, or one RS precode and another code, in conjunction with a Luby Transform (LT) code stage.

11. The non-transitory computer-readable storage medium of claim 10, the method comprising:
upon detecting that the message is below a threshold length:
    adjusting the rate of the RS code; and
    bypassing the LT code stage;
upon detecting that the message is equal to or larger than the threshold length:
    precoding the message with a different precode and a different LT code stage.

12. A non-transitory computer-readable storage device storing computer executable instructions that when executed by a computer control the computer to perform a method for encoding a message to be stored in a data storage system, the method comprising:
accessing a plurality of messages, where a member of the plurality of messages has a message size;
upon determining that the message size of the member of the plurality of messages is greater than or equal to a threshold size:
    selecting a first coding approach as a selected coding approach;
upon determining that the message size of the member of the plurality of messages is less than the threshold size:
    computing an interleaving overhead;
    computing a coding overhead; and
        selecting the first coding approach or a second, different coding approach as the selected coding approach based, at least in part, on the interleaving overhead or the coding overhead;
upon determining that the data storage system is within a threshold reliability level:

automatically and dynamically generating an adapted coding approach by adjusting a set of coding parameters, where the set of coding parameters is based, at least in part, on the selected coding approach;
upon determining that the data storage system is not within the threshold reliability level:
generating an encoded message by encoding the message using the adapted coding approach, and storing the encoded message in the data storage system.

13. The non-transitory computer-readable storage device of claim 12, where the first coding approach is a Fountain coding approach, where the second coding approach is a Reed Solomon coding approach, and where the Fountain coding approach is an online coding approach, a Raptor coding approach, or a Rapar coding approach.

14. The non-transitory computer-readable storage device of claim 13, where selecting a first coding approach or a second, different coding approach as the selected coding approach based, at least in part, on the interleaving overhead or the coding overhead includes:
upon determining that the interleaving overhead is greater than one and the coding overhead is less than a threshold coding overhead level:
selecting a Fountain coding approach as the selected coding approach;
upon detecting that the interleaving overhead is not greater than one and the coding overhead is not less than the threshold coding overhead level:
selecting a Reed Solomon coding approach as the selected coding approach;
upon detecting that a number of parities is less than a threshold number of parities, where the threshold number of parities is four when a STAR coding approach is employed, and where the threshold number of parities is three when a non-STAR coding approach is employed:
using an exclusive or (XOR) based block-maximum distance separable (MDS) coding approach as the selected coding approach;
upon detecting that the number of parities is greater than or equal to the threshold number of parities:
using a classical construction coding approach as the selected coding approach.

15. The non-transitory computer-readable storage device of claim 14, the method further comprising:
decoding the message, where decoding the message includes controlling a Reed Solomon (RS) code decoder, a Fountain code decoder, or a hybrid decoder to decode the encoded message.

16. The non-transitory computer-readable storage device of claim 15, where the set of coding parameters includes:
a number of data units k;
a number of coded units n;
a number of parity units p;
a word size;
a packet size;
a symbol size;
a buffer size;
a decoder failure probability $\gamma$;
a coding parameter q;
a coding overhead $\varepsilon$;
a degree distribution $\Delta(\gamma,\varepsilon)$; and
a precode rate $r_p$.

17. The non-transitory computer-readable storage device of claim 16, where the classical construction coding approach is a Cauchy-RS coding approach or a Vandermonde-RS coding approach, or where the XOR-block MDS coding approach is a Blaum-Roth coding approach, an even-odd coding approach, a row-diagonal parity (RDP) coding approach, a STAR coding approach, or an X-coding approach.

18. The non-transitory computer-readable storage device of claim 17, the method comprising precoding the message with an RS precode, a multiple of RS precodes, or one RS precode and another code, in conjunction with a Luby Transform (LT) code stage.

19. The non-transitory computer-readable storage device of claim 18, the method further comprising:
upon detecting that the message is below a threshold length:
adjusting the rate of the RS code; and
bypassing the LT code stage;
upon detecting that the message is equal to or larger than the threshold length:
precoding the message with a different precode and a different LT code stage.

20. The non-transitory computer-readable storage device of claim 12, the method further comprising:
generating an encoded block that includes the encoded message and metadata associated with the message, where the metadata associated with the message includes a coding flag, a seed, a data identifier, processing information, or a cyclic redundancy check (CRC); and
storing the encoded block in the data storage system, where the data storage system includes one or more data storage devices, where the one or more data storage devices includes a tape drive, a hard disk drive (HDD), a solid state device, (SSD), a hybrid solid state device (HSSD), or a shingled magnetic recording device (SMR), and where the threshold reliability level is based, at least in part, on failure statistics associated with the one or more data storage devices, on wear periods associated with the one or more data storage devices, or on space constraints associated with the one or more data storage devices.

\* \* \* \* \*